(12) United States Patent
Gross

(10) Patent No.: US 7,273,805 B2
(45) Date of Patent: Sep. 25, 2007

(54) REDISTRIBUTION LAYER WITH MICROSTRIPS

(75) Inventor: Harald Gross, Dresden (DE)

(73) Assignee: Infineon Technologies AG, Munich (DE)

( * ) Notice: Subject to any disclaimer, the term of this patent is extended or adjusted under 35 U.S.C. 154(b) by 64 days.

(21) Appl. No.: 11/137,783

(22) Filed: May 25, 2005

(65) Prior Publication Data

US 2006/0267179 A1 Nov. 30, 2006

(51) Int. Cl.
*H01L 21/44* (2006.01)
*H01L 21/4763* (2006.01)

(52) U.S. Cl. .................. 438/612; 438/637; 438/652
(58) Field of Classification Search ........... 438/107, 438/109, 612, 637, 652

See application file for complete search history.

(56) References Cited

U.S. PATENT DOCUMENTS 6,737,345 B1 * 5/2004 Lin et al. .............. 438/601
2006/0046350 A1 * 3/2006 Jiang et al. ............ 438/114

\* cited by examiner

*Primary Examiner*—Hsien-Ming Lee
(74) *Attorney, Agent, or Firm*—Slater & Matsil, L.L.P.

(57) ABSTRACT

A semiconductor device includes a completed semiconductor chip and a dielectric layer overlying the completed semiconductor chip. A redistribution layer overlies the completed semiconductor chip and is embedded in the dielectric layer. The redistribution layer includes a plurality of microstrip conductors. Each microstrip conductor has a height and a width selected such that the height is at least twice the width. In addition, each microstrip conductor is separated from an adjacent microstrip conductor by a spacing distance that is at least twice the width.

10 Claims, 4 Drawing Sheets

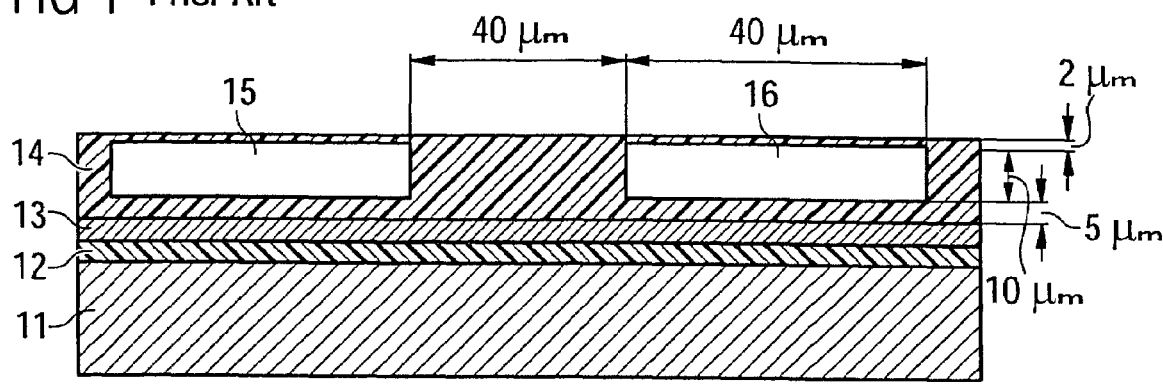
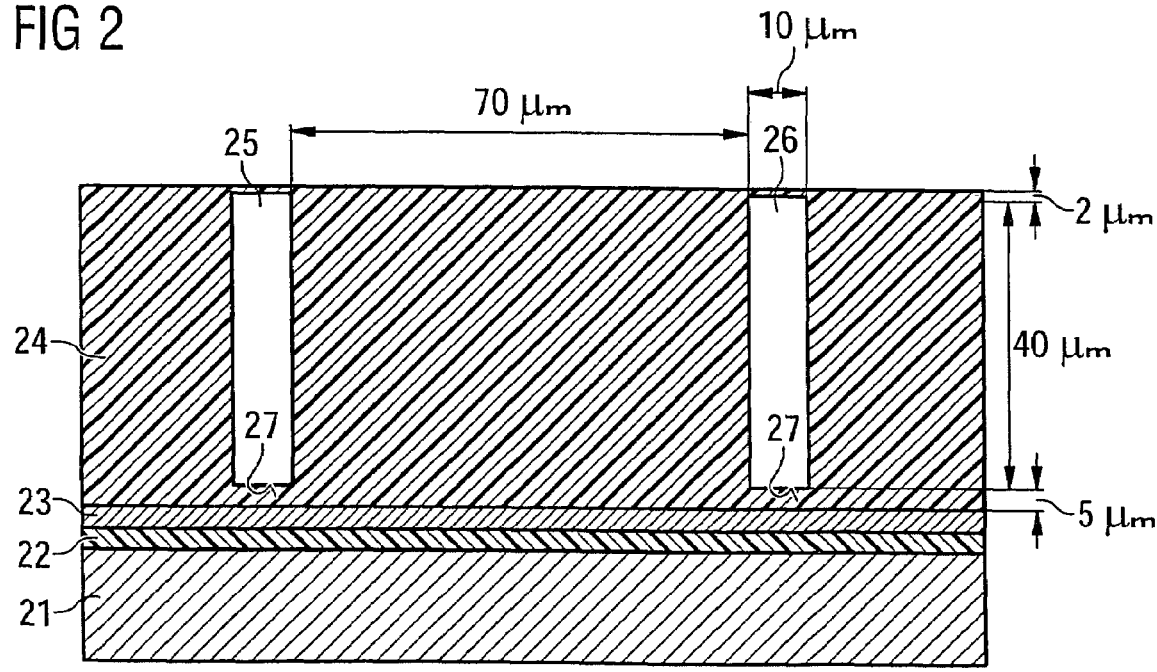

REDISTRIBUTION LAYER WITH MICROSTRIPS

TECHNICAL FIELD

The invention is directed at redistribution layers that include of microstrips on the top surface of a completely processed semiconductor chip.

BACKGROUND

Redistribution layers (RDLs) are typically made of copper or a stack of several metals like a copper layer, a nickel layer on it and a cover layer of gold. These RDLs are used to reroute bond pads on a semiconductor chip, e.g., from a center row to landing pads on the rim of the semiconductor chip. Another example for RDLs is the electrical connection of bond pads on a semiconductor chip with contact pads on compliant elements mounted on the chip.

U.S. Pat. No. 6,664,176 B2, which is incorporated herein by reference, describes a method of generating a pad-rerouting for wafer level packaging, especially for chip size packaging. The method includes forming a flat contact layer on a semiconductor die. Another example of a metal RDL having solderable pads is known from Canadian Patent No. 2,388,926 A1, which is incorporated herein by reference. In this document a flat RDL, made of a stack of metals, is described.

A similar metal RDL is described in European Patent No. 1 351 294 A2, which is incorporated herein by reference. The metal RDL is formed during the last metal layer deposition of the semiconductor circuit before the final passivation is applied. The last metal layer provides structures for solder bump pads that are used for flip chip interconnection. The metal RDL can be a flat layer deposited over the next to last metal layer through an opening in dielectric layer. A final passivation layer is deposited to ensure product reliability.

It is well known that the clock frequency of semiconductors like processors or memories is increased stepwise to higher frequency ranges. At those frequencies, metal leads (such as wire bonds, etc.), which are positioned side by side or one over another, have the characteristic of capacitors.

The parasitic capacitance of current redistribution layers per length unit is estimated with the parallel plate capacitor model and has a value of about 3.5 pF. FIG. 1 illustrates a schematic cross section of a current design with a processed silicon chip 11, a first polymer layer 12 on its top surface and a metallization 13 covered by a second polymer layer 14. In the second polymer layer 14, RDL microstrips 15, 16 are embedded. Between the RDL microstrips 15, 16 and the metallization 13 a small distance is held by the second polymer layer 14.

The general equation for the capacitance is:

$$C = \epsilon_0 * \epsilon_r * A/d \quad (1)$$

d=distance between plates
A=surface area
ε=dielectric constant

The capacitance of the current design is:

$$C_1 = \epsilon_0 * \epsilon_r * 40 \, \mu m * U/5 \, \mu m \quad (2)$$

$$C_2 = \epsilon_0 * \epsilon_r * 10 \, \mu m * U/40 \, \mu m \quad (3)$$

$$C_{tot} = C_1 + C_2 = (8 + 1/4) * \epsilon_0 * \epsilon_r * U \quad (4)$$

These equations are based on the following assumptions:

| | |
|---|---|
| Width of the RDL: | 40 μm |
| Distance between the RDL: | 40 μm |
| Thickness of RDL: | 10 μm |
| Distance from RDL to Metal 2: | 5 μm |

Therefore, the critical frequency of an RDL is dominated by its parasitic capacitance. Next and future chip generations require higher critical frequencies but this can most likely not be achieved with today's design of RDLs.

SUMMARY OF THE INVENTION

In one aspect, the invention provides an RDL microstrip on the surface of the chip. The configuration has very low parasitic capacitance between the RDL and the upper layer of metallization of the chip.

In another aspect, the invention increases the critical frequency of the RDL on the chip to a higher amount.

In another aspect, the invention flips the RDL microstrip at 90° over the surface of the chip and embeds it completely in an isolating layer, e.g., a polymer, with a small distance between the lower edge of the microstrip and the top metallization layer of the chip.

The flipped microstrip reduces the parasitic capacitance between the RDL and the top metallization to about 1/3 in comparison with the prior art shown in FIG. 1 and discussed in the background. The capacitance between neighboring RDL lines is also decreased, since the distance between the RDL lines is increased from about 40 μm (prior art) to about 70 μm according to an embodiment of the invention.

The equation for the capacitance of the new design is:

$$C_{tot} = C_1 + C_2 = (2 + 4/7) * \epsilon 0 * \epsilon r * U \quad (5)$$

$$C_1 = \epsilon 0 * \epsilon r * 10 \, \mu m * U/5 \, \mu m \quad (6)$$

$$C_2 = \epsilon 0 * \epsilon r * 40 \, \mu m * U/70 \, \mu m \quad (7)$$

The current design has a 3.2 times higher parasitic capacitance compared to the proposed one. This calculation is shown in Equation (8).

$$C_{tot\text{-}prior\,art} = (8 1/4)/(2 4/7) * C_{tot\text{-}new} \approx 3.21 * C_{tot\text{-}new} \quad (8)$$

In one embodiment, the microstrip has a rectangular cross section with a high aspect ratio. For example, the aspect ratio can be between 2 and 10 (i.e., the ratio of the height of the microstrip to the width of the microstrip is between 2:1 and 10:1).

Another possibility to reduce the parasitic capacitance further is to flip a microstrip with a v-shaped cross section in a way that the small edge is adjacent to the surface of the chip.

For realizing those structures it is possible to use a positive photoresist, which typically shows sloped sidewalls due to reduced exposure doses at the border between bright and dark field areas. After developing the exposed photoresist the resulting triangular structure is filled with metal from the bottom to the top during electroplating.

The microstrips are made of a metal-like copper.

The microstrips can be embedded in an insulating layer like a polymer or, for an easier processing, in a photoresist. The polymer fixes the microstrip after processing at is predefined position above the top metallization of the chip.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 shows a schematic cross section of a known arrangement;

FIG. 2 shows a schematic cross section of the new arrangement of the flipped RDL microstrips with low parasitic capacitance;

DETAILED DESCRIPTION OF ILLUSTRATIVE EMBODIMENTS

Figure 3A:
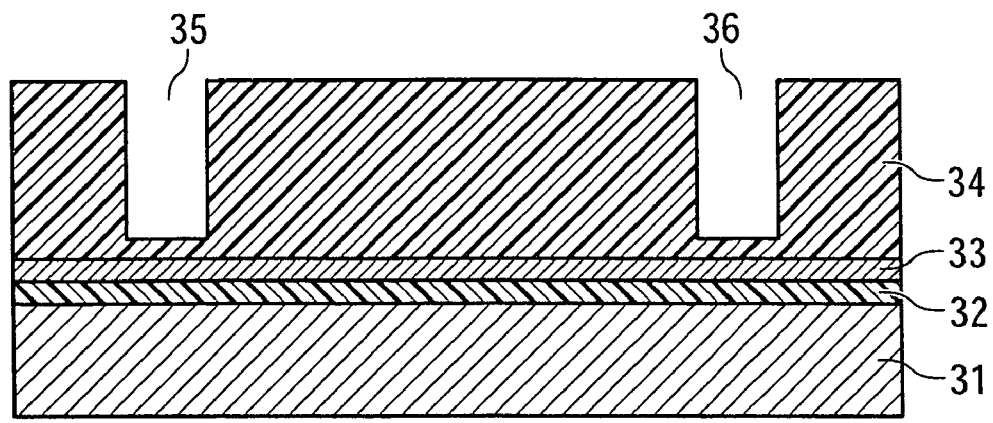
FIGS. 3a-3f illustrate a simplified process flow to realize the RDL microstrips as shown in FIG. 1.
Figure 3B:
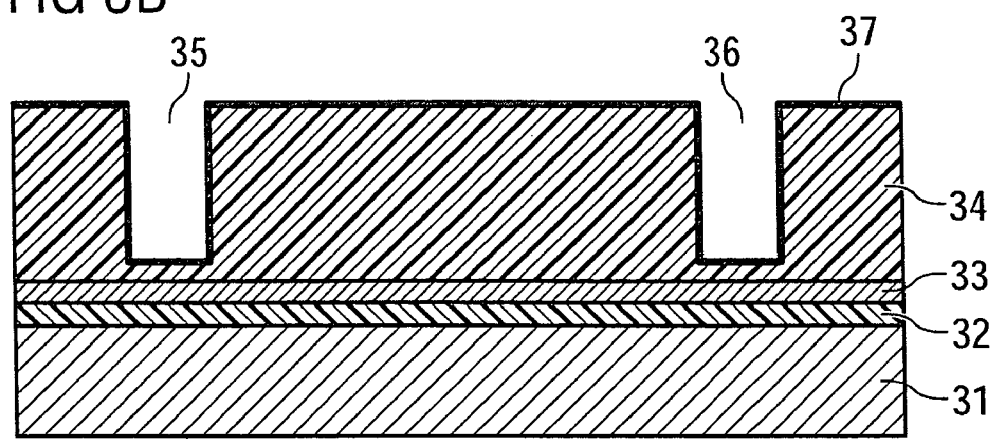
Figure 3C:
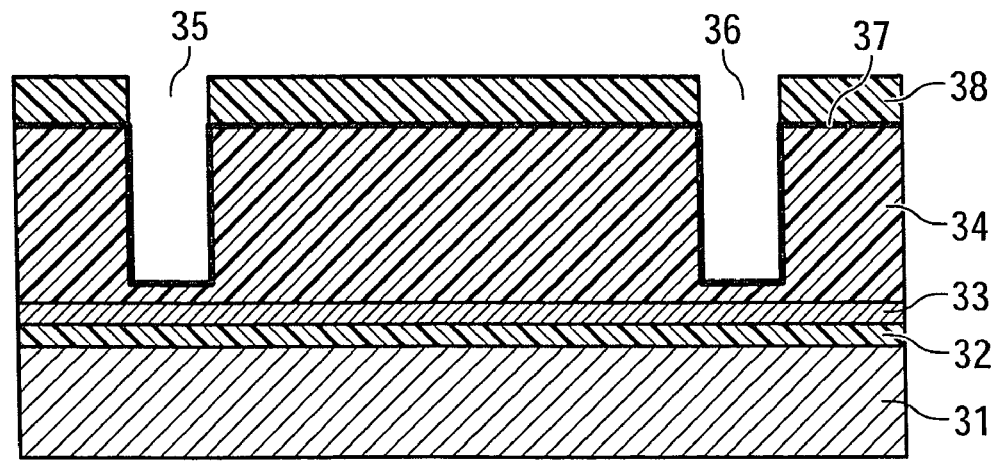

FIG. 2 shows an embodiment of the invention with a completely processed silicon chip 21 with a first polymer layer 22 on its top surface and a metallization 23 covered by a second polymer layer 24. In this context, a completed semiconductor ship is one that has all of its circuits fully interconnected and only needs external connection to be operational. RDL microstrips 25, 26 are embedded in the second polymer layer 24. The RDL microstrips 25 and 26 are flipped at 90° compared to the surface of the chip 21 so that the microstrips 25 and 26 are embedded completely in the second polymer layer 24 and are fixed with a small distance between the lower edges 27 of the RDL microstrips 25 and 26 and the top metallization 23 of the chip 21.

The flipped RDL microstrips 25 and 26 reduce the parasitic capacitance between RDL microstrips 25, 26 and the top metallization 23 (e.g., metal 2 in a double metal chip) to ⅓ of the value of the parasitic capacitance of the prior art. The capacitance between neighboring RDL microstrips 25 and 26 is decreased as well, since the horizontal distance between the lines is increased from about 40 μm (prior art) to about 70 μm according the new design.

In one embodiment, the microstrips 25 and 26 have a height that is greater than its width. In the embodiment of FIG. 2, the ratio of height to width is 4:1. In other embodiments, the ratio may be between 2:1 and 10:1. In this same embodiment, the ratio of the spacing distance between microstrips 25 and 26 is 7:1. In other embodiments, the ratio can be between 3:1 and 20:1.

FIGS. 3a-3f illustrate a simplified process flow for manufacturing flipped RDL microstrips 25 and 26. FIG. 3a shows a silicon substrate 31 with a first polymer layer 32 and a metallization 33 on its surface. A thick layer of a dielectric, e.g. a polymer such as photoresist, is deposited on the metallization 33 with structured openings 35 and 36. These openings are structured with a well-known photolithography technique at the same time at which the fuse coverage is performed. This is the starting state. After this, a seed layer 37 is deposited on the whole surface (FIG. 3b) and a further photolithography step is performed by depositing a photoresist 38, which is structured by photolithography in a way that the seed layer 37 is covered at the flat surface (FIG. 3c), but not in the openings 35 and 36 in the first photoresist 34.

Figure 3D:
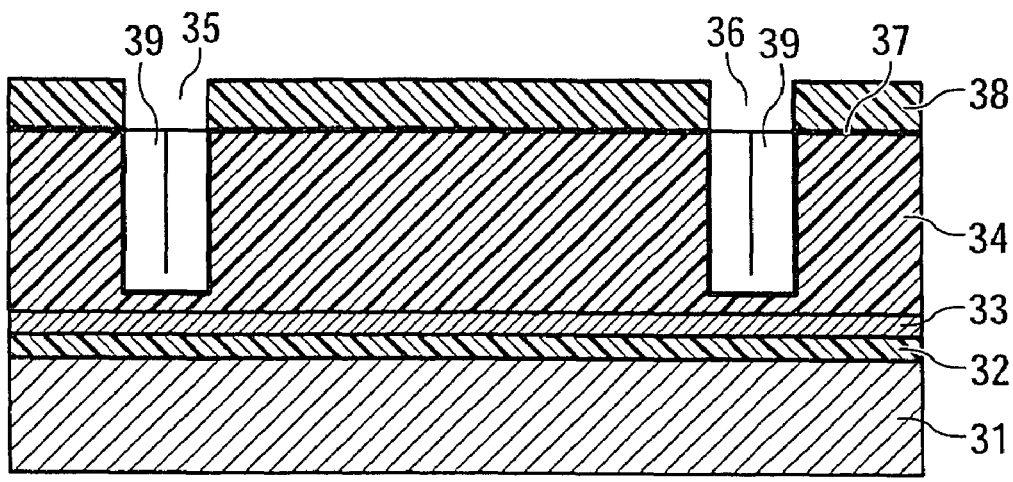
Figure 3E:
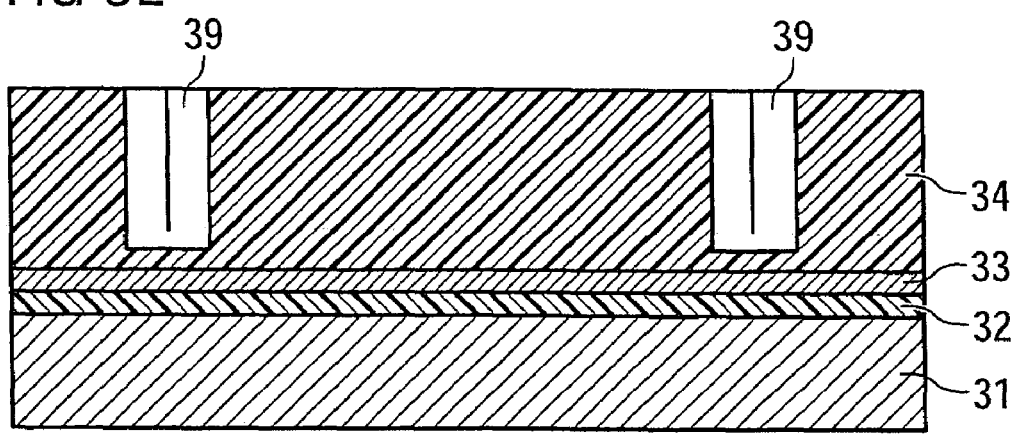

Now electroplating of copper 39 or any other material according to well-known procedures can be performed. The deposition of the metal can be controlled by controlling the current density during the deposition. Because of the seed layer 37 in the openings 35 and 36, the copper is plated in the openings 35 and 36 only (FIG. 3d). As a result flipped RDL micro strips 25 and 26 as shown in FIG. 2 are generated. Compared with the current process flow only half of the copper thickness must be electroplated. This provides a significant cost reduction.

Figure 3F:
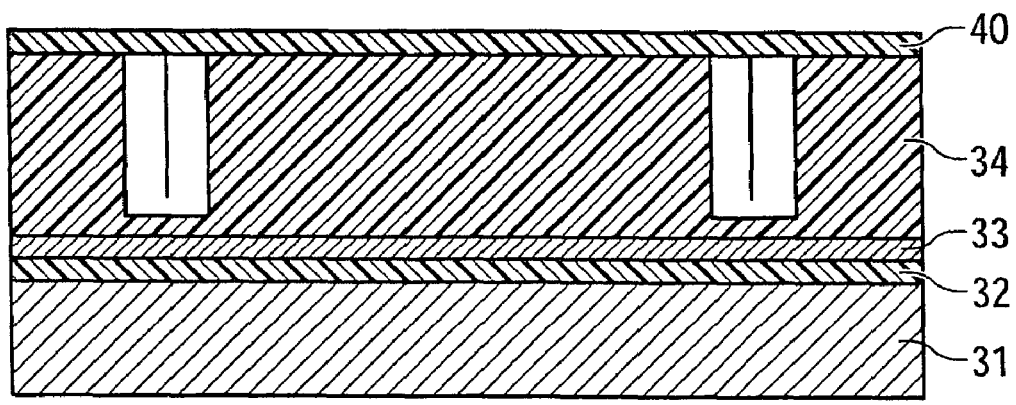

After electroplating, the second photoresist 38 and the seed layer 37 are stripped (FIG. 3e) and finally a third dielectric, e.g., photoresist, 40 is deposited on the top surface to protect the copper from corrosion as can be seen in FIG. 3f.

Figure 4:
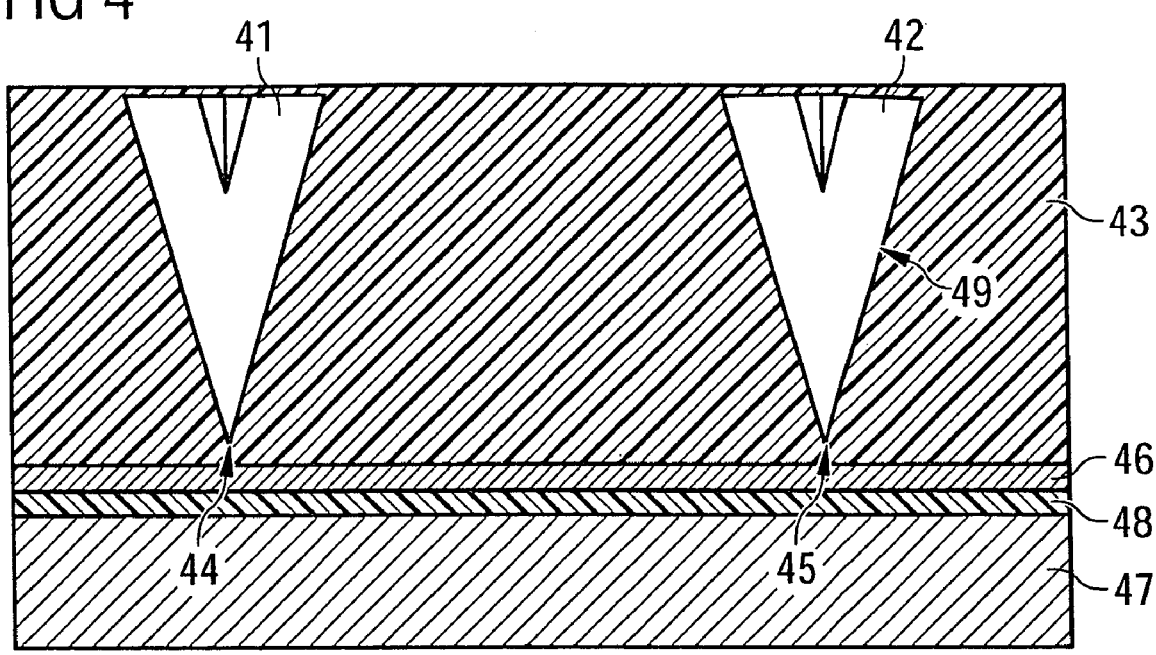
FIG. 4 shows a special embodiment of the RDL microstrips with a v-shaped cross section.

FIG. 4 shows a special embodiment of RDL microstrips 41 and 42 with v-shaped cross sections embedded in a polymer layer 43 with their edges 44 and 45 opposite the top metallization 46 of the silicon chip 47. The RDL microstrips 41 and 42 are fixed in the polymer 43 with a small distance to the metallization 46. The metallization 46 is insulated from the silicon chip 47 by a first polymer 48.

This embodiment uses the effect that positive photoresist shows sloped sidewalls 49 due to the reduced exposure doses at the border between bright and dark field areas. These sloped sidewalls lead to a v-formed cross section of the deposited metal. This effect is used to reduce the parasitic capacitance even more compared to previously described geometry. In addition, any voids in the center are prevented because the sketched v-shaped structure is filled with metal from the bottom to the top during electroplating.

It is noted that the number of RDL microstrips on the surface of a silicon chip is not limited and the RDL microstrips with the new design can be manufactured with other technologies without leaving the scope of this invention.

What is claimed is:

1. A method of making a semiconductor device, the method comprising:
    fabricating a semiconductor integrated circuit that includes an uppermost metallization level;
    forming a dielectric layer over the semiconductor integrated circuit and over the uppermost metallization;
    forming a plurality of trenches in the dielectric layer, each of the trenches having a width and a depth that is greater than the width, a bottom surface of the trench being electrically isolated from the uppermost metallization; and
    filling the trenches with a conductor, the conductor serving as a redistribution layer that reroutes contact areas in the uppermost metallization.

2. The method of claim 1, wherein filling the trenches comprises:
    depositing a seed layer within the trenches; and
    electrodepositing the conductor over the seed layer.

3. The method of claim 2, wherein depositing a seed layer within the trenches further deposits a seed layer over an upper surface of the dielectric layer outside the trenches, the method further comprising forming a masking layer over the upper surface of the dielectric layer to prevent the conductor from being electrodeposited on the upper surface.

4. The method of claim 2, wherein the conductor comprises copper.

5. The method of claim 1, wherein forming a plurality of trenches comprises forming substantially rectangular shaped trenches, wherein the ratio of the depth to the width of each trench is at least 4:1.

6. The method of claim 1, wherein forming a plurality of trenches comprises forming trenches that have sloping sidewalls.

7. The method of claim 6, wherein forming a plurality of trenches comprises forming a plurality of v-shaped trenches.

8. The method of claim 1, wherein forming a dielectric layer comprises forming a polymer layer.

9. The method of claim 8, wherein forming a dielectric layer comprises forming a photoresist layer.

10. The method of claim 1, wherein the ratio of the depth of the trench to the width of the trench is between about 2:1 and 10:1 and wherein each trench is separated from a closest adjacent trench by at least a minimum spacing distance, wherein the ratio of the minimum spacing distance to the width of the trench is at least 5:1.

* * * * *